United States Patent
Taguchi et al.

(10) Patent No.: US 10,978,216 B2
(45) Date of Patent: Apr. 13, 2021

(54) CONDUCTIVE FILM AND METHOD FOR PRODUCING THE SAME

(71) Applicant: Sumitomo Riko Company Limited, Aichi-ken (JP)

(72) Inventors: Yutaro Taguchi, Aichi-ken (JP); Hiroaki Ito, Aichi-ken (JP); Yusaku Takagaki, Aichi-ken (JP)

(73) Assignee: SUMITOMO RIKO COMPANY LIMITED, Aichi-ken (JP)

( * ) Notice: Subject to any disclaimer, the term of this patent is extended or adjusted under 35 U.S.C. 154(b) by 0 days.

(21) Appl. No.: 15/952,705

(22) Filed: Apr. 13, 2018

(65) Prior Publication Data

US 2018/0233250 A1 Aug. 16, 2018

Related U.S. Application Data

(63) Continuation of application No. PCT/JP2017/009470, filed on Mar. 9, 2017.

(30) Foreign Application Priority Data

Mar. 30, 2016 (JP) ............................ JP2016-067488

(51) Int. Cl.
| | | |
|---|---|---|
| H01B 1/24 | (2006.01) | |
| H01B 5/16 | (2006.01) | |
| H01B 13/00 | (2006.01) | |
| H05K 1/09 | (2006.01) | |
| H05K 1/03 | (2006.01) | |
| H05K 1/02 | (2006.01) | |

(52) U.S. Cl.
CPC .............. *H01B 1/24* (2013.01); *H01B 5/16* (2013.01); *H01B 13/0036* (2013.01); *H05K 1/092* (2013.01); *H05K 1/0283* (2013.01); *H05K 1/0393* (2013.01); *H05K 2201/0314* (2013.01); *H05K 2201/0323* (2013.01)

(58) Field of Classification Search
CPC ........ H01B 1/24; H01B 5/16; H01B 13/0036; H01B 1/20; H05K 1/092; H05K 1/0283; H05K 1/0393; H05K 2201/0314; H05K 2201/0323; H05K 1/095; H05K 2201/0245; H05K 2201/0393; B05D 5/02; B05D 5/12; C09D 5/24; C09D 11/52; B23B 2307/408; C08K 3/04; C08K 3/042; C01B 32/19; C01B 32/192; C01B 32/21; C01B 32/225
USPC ........................................................ 252/500
See application file for complete search history.

(56) References Cited

U.S. PATENT DOCUMENTS

| | | | | |
|---|---|---|---|---|
| 6,037,400 A * | 3/2000 | Kitahata | ................... | C08K 3/04 524/495 |
| 7,282,260 B2 * | 10/2007 | LeGrande | ................. | C09D 5/24 428/323 |
| 2010/0000441 A1 * | 1/2010 | Jang | ....................... | C09D 11/30 106/31.13 |
| 2012/0119626 A1 | 5/2012 | Takahashi et al. | | |
| 2013/0069013 A1 * | 3/2013 | Esseghir | .................. | H01B 1/24 252/511 |
| 2014/0202744 A1 * | 7/2014 | Kobayashi | ............... | H05K 1/11 174/254 |
| 2014/0202745 A1 | 7/2014 | Kobayashi et al. | | |
| 2014/0212656 A1 | 7/2014 | Rudhardt et al. | | |
| 2016/0059444 A1 | 3/2016 | Wang et al. | | |

FOREIGN PATENT DOCUMENTS

| | | |
|---|---|---|
| CN | 103946927 A | 7/2014 |
| CN | 103959395 A | 7/2014 |
| JP | 2009-227985 A | 10/2009 |
| WO | 2011/145411 A1 | 11/2011 |
| WO | 2013/026827 A1 | 2/2013 |
| WO | 2013/146254 A1 | 10/2013 |
| WO | 2013/146262 A1 | 10/2013 |

OTHER PUBLICATIONS

Nacken et al. ("Delamination of graphite in a high pressure homogenizer" RSC Adv., 5, pp. 57329-57338) (Year: 2015).*
International Preliminary Report on Patentability from Patent Application No. PCT/JP2017/009470, dated Dec. 19, 2017 with English translation.
Chinese Office Action, Chinese Patent Office, Patent Application No. 201780003549.8, dated May 22, 2019, with English translation.
Notification of reasons for refusal issued in Japan Counterpart Patent Appl. No. 2017-564148, dated Jan. 23, 2018.
International Search Report and Written Opinion from Patent Application No. PCT/JP2017/009470, dated Apr. 25, 2017.
International Preliminary Report on Patentability from Patent Application No. PCT/JP2017/009470, dated Dec. 19, 2017.

* cited by examiner

*Primary Examiner* — Matthew R Diaz

(74) *Attorney, Agent, or Firm* — Greenblum & Bernstein, P.L.C.

(57) ABSTRACT

A conductive film of the present invention includes an elastomer and a flake-like carbon material. An amount of the flake-like carbon material in the conductive film is 20 parts by mass or more and 60 parts by mass or less when a total solid content excluding a conductive agent is 100 parts by mass. A gloss level of a surface of the conductive film measured at an incidence angle of 20° is more than 0.4% and less than 10%. A method for producing a conductive film of the present invention includes the steps of preparing a liquid composition including an elastomer, a conductive agent including at least one of graphite powder and expanded graphite powder, and a solvent; subjecting the liquid composition to a grinding treatment using a wet jet mill; and applying the liquid composition after the grinding treatment to a base material, and curing the coating film.

14 Claims, 1 Drawing Sheet

【Fig. 1】
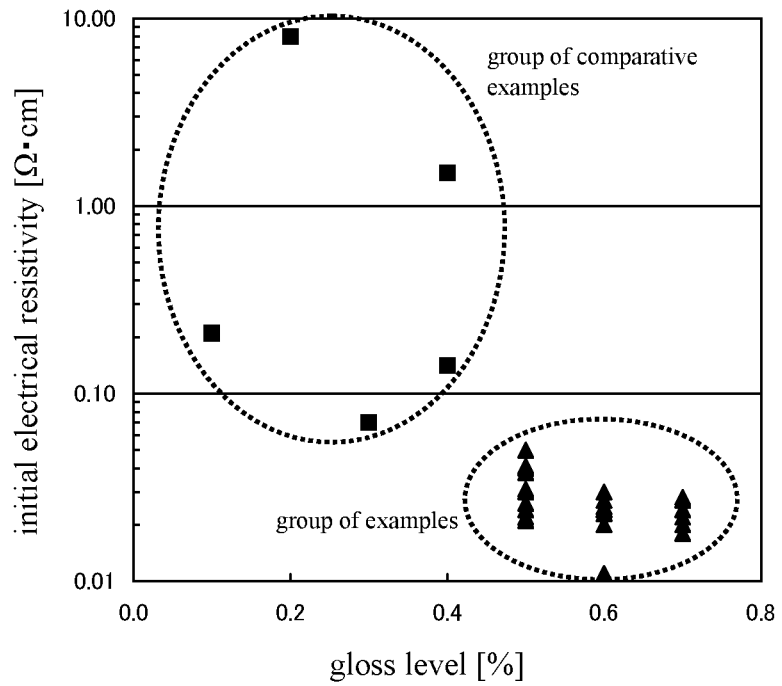
【Fig. 2】
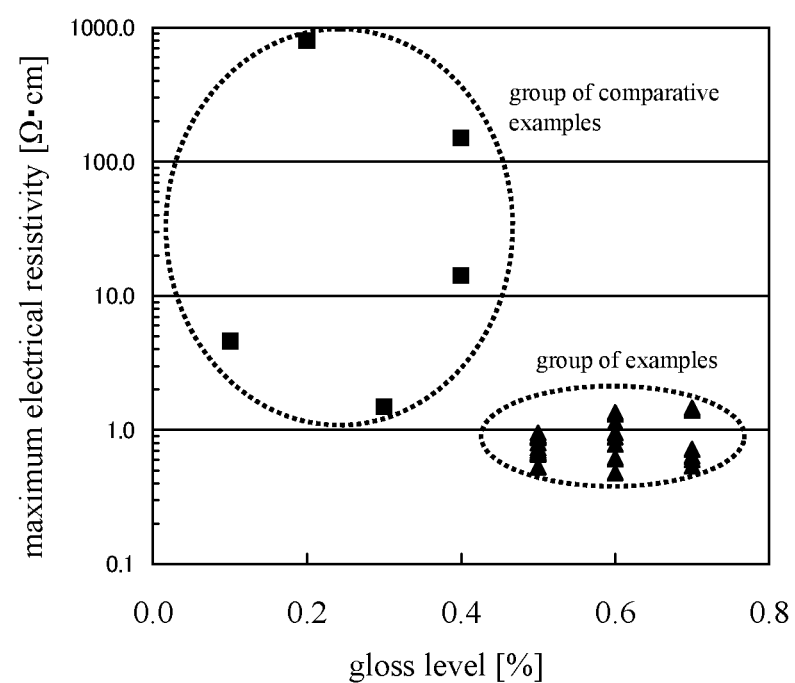

CONDUCTIVE FILM AND METHOD FOR PRODUCING THE SAME

CLAIM FOR PRIORITY

This application is a Continuation of PCT/JP2017/009470 filed Mar. 9, 2017, and claims the priority benefit of Japanese application 2016-067488 filed Mar. 30, 2016, the contents of which is expressly incorporated by reference herein in its entirety.

BACKGROUND OF THE INVENTION

1. Field of the Invention

The present invention relates to a conductive film suitable as electrodes and electric wires for a flexible transducer that uses a polymer material, electromagnetic wave shields, flexible wiring boards, and the like, and to methods for producing the conductive film.

2. Description of Related Art

Highly flexible, compact and lightweight transducers have been developed by using polymer materials such as elastomers. Such a transducer includes a dielectric layer made of an elastomer interposed between electrodes, for example. When the voltage applied between the electrodes is changed, the dielectric layer expands or contracts. Therefore, in a flexible transducer, electrodes and electric wires are required to have elasticity to follow deformation of the dielectric layer. A known material for expandable and contractible electrodes and electric wires is a conductive rubber composition produced by blending a conductive agent such as a carbon material into rubber, as described in Patent Document 1, for example.

Patent Document 1: Japanese Patent Application Publication No. 2009-227985 (JP 2009-227985 A)
Patent Document 2: WO 2013/146254

SUMMARY OF THE INVENTION

Among the carbon materials used as conductive agents, when a conductive carbon black or graphite powder is blended into an elastomer, the particles are less likely to contact one another, and the area of contact points is small. Thus, in order to impart a desired conductivity to the composition, the amount of the conductive agent to be blended needs to be increased, which may impair the flexibility. Moreover, upon expansion of the composition, conduction resulting from contact between the particles ceases, which significantly increases the electrical resistance. On the other hand, when multi-walled carbon nanotubes, which have a relatively large aspect ratio, are blended into an elastomer, even though the multi-walled carbon nanotubes are likely to contact one another, the conductivity of the multi-walled carbon nanotubes per se is low, which increases the electrical resistance of the composition. Thus, the extent to which the conductivity of the composition can be increased while maintaining the flexibility is limited. Moreover, single-walled carbon nanotubes and graphene (structural unit of graphite) have relatively large aspect ratios and high conductivities. These materials, however, are likely to aggregate, and thus, may cause a large increase in viscosity when dispersed in elastomer solutions to produce coating materials. With these materials, therefore, it is difficult to form thin films using printing methods, for example.

Patent Document 2, for example, describes a conductive film including an elastomer; a fibrous carbon material having a fiber diameter of less than 30 nm; and a flake-like carbon material having a maximum length of 150 nm or more and a thickness of less than 50 nm. In the conductive film described in Patent Document 2, the flake-like carbon material serves to connect the fibers of the fibrous carbon material with one another to inhibit an increase in electrical resistance during expansion. However, in the conductive film described in Patent Document 2, after repeated expansion, it is difficult to maintain the initial conductivity, and thus, a further improvement in terms of conductivity durability is desired.

The present invention has been made in view of the above-described circumstances, and an object of the present invention is to provide a conductive film that has a high conductivity, and is less likely to increase the electrical resistance even after repeated expansion, and methods for producing the conductive film.

(1) To solve the above-described object, a conductive film of the present invention is characterized by including an elastomer and a flake-like carbon material, wherein an amount of the flake-like carbon material in the conductive film is 20 parts by mass or more and 60 parts by mass or less when a total solid content excluding a conductive agent is 100 parts by mass, and a gloss level of a surface of the conductive film measured at an incidence angle of 20° is more than 0.4% and less than 10%.

In the conductive film of the present invention, the gloss level of the surface measured at an incidence angle of 20° is more than 0.4%. This is because the flake-like carbon material is oriented along the surface of the conductive film of the present invention. The flake-like carbon material is a material obtained by flaking graphite or the like. Graphene, which is a structural unit of graphite, has an electronic state close to that of a metal. Thus, as the flaking of graphite proceeds, the electronic state thereof becomes closer to that of graphene, such that a metallic gloss is achieved. Therefore, it is believed that when the gloss level of the surface is greater, the amount of the oriented flake-like carbon material that is present is greater, and the flake-like carbon material that is present is more flaked (thinner). The flake-like carbon material has a relatively large aspect ratio (length/thickness). Thus, the particles of the flake-like carbon material are likely to contact one another to readily form conduction paths. Additionally, because the flake-like carbon material is oriented in a surface direction, the conductive paths are less likely to be disconnected even upon expansion. Therefore, in the conductive film of the present invention, the initial (before expansion) conductivity is high, and the electrical resistance is less likely to increase even after repeated expansion. That is, the conductive film of the present invention has excellent conductivity durability in a sense that it can maintain a high conductivity.

In the present specification, a value measured with a gloss meter "PG-1M" from Nippon Denshoku Industries Co., Ltd. is adopted as the gloss level of the surface of the conductive film.

(2) To solve the above-described object, a first method for producing a conductive film of the present invention is characterized by including the steps of preparing a liquid composition including an elastomer, a conductive agent including at least one of graphite powder and expanded graphite powder, and a solvent; subjecting the liquid composition to a grinding treatment using a wet jet mill; and applying the liquid composition after the grinding treatment to a base material and curing a coating film to obtain a conductive film in which a gloss level of a surface of the conductive film measured at an incidence angle of 20° is more than 0.4% and less than 10%.

In the grinding treatment step, the liquid composition is subjected to a grinding treatment using a wet jet mill, which exfoliates the graphite (expanded graphite) in the liquid composition by a shear force, causing flaking to proceed. In this manner, multilayer graphene whose number of layers of graphene is smaller than that of the raw material graphite (expanded graphite) is produced. Multilayer graphene is included in the flake-like carbon material of the conductive film of the present invention. As described above, in the grinding treatment step, the liquid composition in which multilayer graphene (flake-like carbon material) or the like is dispersed in the elastomer solution is obtained. In the subsequent curing step, the liquid composition is applied to the base material, and the coating film is cured to obtain the conductive film having a predetermined gloss level. According to the first method for producing a conductive film of the present invention, the flake-like carbon material can be readily produced, and the conductive film of the present invention can be readily produced. Moreover, as compared to a second method for producing a conductive film of the present invention that will be described later, the first method can perform the grinding treatment at a higher solids concentration, thereby allowing the solids concentration or viscosity of the liquid composition to be adjusted in a wider range.

Note that in the production of the conductive film described in Patent Document 2 above, the carbon materials used as raw materials are treated in a bead mill. Thus, pulverization due to fracture of the carbon materials is likely to proceed, rather than flaking due to exfoliation. Therefore, multilayer graphene (flake-like carbon material) for achieving the conductive film having a predetermined gloss level cannot be obtained.

(3) To solve the above-described object, a second method for producing a conductive film of the present invention is characterized by including the steps of: subjecting a conductive agent dispersion including a solvent and a conductive agent including at least one of graphite powder and expanded graphite powder to a grinding treatment using a wet jet mill; adding an elastomer solution including an elastomer and a solvent to the conductive agent dispersion after the grinding treatment to prepare a liquid composition; and applying the liquid composition to a base material and curing a coating film to obtain a conductive film in which a gloss level of a surface of the conductive film measured at an incidence angle of 20° is more than 0.4% and less than 10%.

In the grinding treatment step, the conductive agent dispersion is subjected to a grinding treatment using a wet jet mill, which exfoliates the graphite (expanded graphite) in the conductive agent dispersion by a shear force, causing flaking to proceed. In this manner, multilayer graphene whose number of layers of graphene is smaller than that of the raw material graphite (expanded graphite) is produced, as in the grinding treatment step of the first method. That is, in the grinding treatment step of the second method for producing a conductive film of the present invention, the conductive agent dispersion in which multilayer graphene (flake-like carbon material) or the like is dispersed in the solvent is obtained. In the subsequent liquid composition preparation step, the elastomer solution is added to the conductive agent dispersion to prepare the liquid composition. Then, as in the curing step of the first method, the liquid composition is applied to the base material, and the coating film is cured to obtain the conductive film having a predetermined gloss level. According to the second method for producing a conductive film of the present invention, the flake-like carbon material can be readily produced, and the conductive film of the present invention can be readily produced. Moreover, as compared to the previously described first method for producing a conductive film of the present invention, there is no possibility that the molecular weight of the polymer may be reduced by the grinding treatment.

BRIEF DESCRIPTION OF THE DRAWINGS

FIG. 1 is a graph showing the relationship between the gloss level and the initial electrical resistivity of conductive films.

FIG. 2 is a graph showing the relationship between the gloss level and the maximum electrical resistivity in an elongation durability test of conductive films.

DETAILED DESCRIPTION OF THE EMBODIMENTS

<Conductive Film>

A conductive film of the present invention includes an elastomer and a flake-like carbon material. An elastomer having a glass transition temperature (Tg) not higher than room temperature is preferably used as the elastomer, from the viewpoint of having rubber-like elasticity at ordinary temperature. As the Tg decreases, the crystallinity decreases. Thus, the elastomer becomes more likely to expand and contract. For example, an elastomer having a Tg of 0° C. or lower, −10° C. or lower, or −30° C. or lower is more flexible and preferred.

The elastomer is preferably a crosslinked rubber, because it has excellent resiliency when subjected to repeated deformations. The elastomer may also be a pseudo-crosslinked product having a microphase separation structure composed of a hard segment and a soft segment, such as a thermoplastic elastomer. Examples of thermoplastic elastomers include olefin-, styrene-, polyester-, acrylic-, urethane-, and vinyl chloride-based thermoplastic elastomers. Examples of crosslinked rubbers include urethane rubber, acrylic rubber, silicone rubber, butyl rubber, butadiene rubber, ethylene oxide-epichlorohydrin copolymer, nitrile rubber, hydrogenated nitrile rubber, chloroprene rubber, natural rubber, isoprene rubber, styrene-butadiene rubber, ethylene-propylene-diene copolymer (EPDM), polyester rubber, and fluororubber. Those modified by, for example, the introduction of functional groups, such as epoxidized natural rubber and carboxyl group-modified hydrogenated nitrile rubber, are also usable.

In particular, acrylic rubber, which has low crystallinity and weak intermolecular forces, has a Tg lower than those of other rubbers. Thus, acrylic rubber is flexible and highly elastic, and is suitable as electrodes for a transducer, for example. Acrylic rubber having, for example, an elongation of 1500% or more and a tensile strength of 0.1 MPa or more in an uncrosslinked state is preferred. As the elongation and the tensile strength in the uncrosslinked state, values obtained from a stress-elongation curve measured using the following method are adopted. Initially, an acrylic rubber polymer solution before being crosslinked is applied onto a release-treated polyethylene terephthalate (PET) base material to a target thickness of 500 µm, and dried at 150° C. for 2 hours. Then, the base material having the coating film formed thereon is cut into a size of 10 mm in width and 40 mm in length, and the coating film is removed from the base material and used as a specimen. The specimen is then subjected to a tensile test using a static testing machine "AUTOGRAPH AGS-X (100 N)" from Shimadzu Corporation to measure the elongation versus the stress upon uniaxial elongation at a distance between the chucks of 20 mm and a tensile rate of 100 mm/min.

When heat resistance and wear resistance are to be imparted to the conductive film, a fluororubber is preferably used. When the heat resistance of the conductive film is improved, an increase in electrical resistance can be inhibited even after repeated expansion at high temperatures. When the wear resistance of the conductive film is improved, the conductive film is less likely to wear out even if it is brought into sliding contact with another component in a sliding part, for example, and an increase in electrical resistance can be inhibited.

When cold resistance is to be imparted to the conductive film, an elastomer having a low Tg may be selected. For example, an elastomer having a Tg of −30° C. or lower is preferred. In this case, such an elastomer having a low Tg may be used alone, or may be used as a blend with another elastomer. Cold resistance can also be improved by blending a plasticizer, as described below. When the cold resistance of the conductive film is improved, the flexibility is less likely to decrease even at low temperatures, and an increase in electrical resistance can be inhibited even after repeated expansion.

The flake-like carbon material can be produced from a carbon material having a graphite structure, such as graphite or expanded graphite. The flake-like carbon material is preferably multilayer graphene, which is a layered material of a plurality of layers of graphene. Graphene corresponds to one layer of graphite, and has a structure in which six-membered rings of carbon atoms are connected two-dimensionally. The number of layers of graphene in multilayer graphene is preferably smaller than that of graphite, and from several to several hundreds.

The amount of the flake-like carbon material in the conductive film of the present invention is 20 parts by mass or more and 60 parts by mass or less when a total solid content excluding a conductive agent is taken as 100 parts by mass. If the amount of the flake-like carbon material is less than 20 parts by mass, the particles of the flake-like carbon material are less likely to contact one another, and conduction paths that can tolerate elongation cannot be formed. In this case, it is believed that the gloss level of the surface of the conductive film will become 0.4% or less. Conversely, if the amount of the flake-like carbon material is over 60 parts by mass, the flexibility of the conductive film will decrease. The conductive agent is a material that imparts a conductivity to the conductive film, which includes the flake-like carbon material.

The gloss level of the surface of the conductive film of the present invention is more than 0.4% and less than 10%, as measured at an incidence angle of 20°. If the gloss level is 0.4% or less, the flake-like carbon material will not be sufficiently oriented, and thus, a desired conductivity cannot be achieved. The gloss level is preferably 0.5% or more. Conversely, if the gloss level is 10% or more, the flexibility of the conductive film will decrease, and the durability upon repeated expansion will decrease. The gloss level is preferably 5% or less. The gloss level is more preferably 1.5% or less.

The conductive film of the present invention may contain other conductive agents in addition to the flake-like carbon material. Suitable examples of other conductive agents include conductive carbon blacks and carbon nanotubes. In particular, when a conductive carbon black is contained, the conductive carbon black can adjust the viscosity of the liquid composition as a thickener, or can improve the strength of the conductive film.

The conductive film of the present invention may contain additives such as a crosslinking agent, a crosslinking accelerator, a crosslinking aid, a dispersant, a plasticizer, a processing aid, an antioxidant, a softener, and a colorant. The crosslinking agent, crosslinking accelerator, crosslinking aid, and the like that contribute to the crosslinking reaction may be selected as appropriate, in accordance with the type of the elastomer. The inclusion of a plasticizer improves the cold resistance of the conductive film. Examples of plasticizers include adipic acid diesters and ether-ester derivatives.

The inclusion of a dispersant inhibits aggregation of the flake-like carbon material to improve the dispersibility. Examples of dispersants include a polymeric surfactant having an organic salt structure in which an anion and a cation form an ionic bond (for example, a high-molecular-weight polyester acid amidoamine salt); and a polymer in which a polycyclic aromatic component and an oligomer component form an amide bond or an imide bond. The polycyclic aromatic component in the latter polymer has $\pi$-$\pi$ interactions, and contributes to the affinity for the flake-like carbon material. The polycyclic aromatic component has a plurality of ring structures including an aromatic ring. The number and the arrangement of the rings are not particularly limited. The polycyclic aromatic component preferably has any of a benzene ring, a naphthalene ring, an anthracene ring, a phenanthrene ring, a pyrene ring, a perylene ring, and a naphthacene ring, for example. In consideration of flexibility, the polycyclic aromatic component preferably has a biphenyl structure in which benzene rings are connected or a structure having naphthalene rings. The oligomer component that forms an amide bond or an imide bond with the polycyclic aromatic component contributes to the affinity for the elastomer. The oligomer component is preferably compatible with the elastomer.

<Method for Producing Conductive Film>

(1) First Method for Producing Conductive Film

A first method for producing a conductive film of the present invention includes a liquid composition preparation step, a grinding treatment step, and a curing step. Each of these steps will be described in the mentioned order, hereinafter.

[Liquid Composition Preparation Step]

This step is the step of preparing a liquid composition including an elastomer, a conductive agent including at least one of graphite powder and expanded graphite powder, and a solvent.

The elastomer is as described above in connection with the conductive film of the present invention. In this step, a rubber polymer before being crosslinked or a thermoplastic elastomer may be used.

Powder of natural graphite or artificial graphite may be used as the graphite powder serving as a conductive agent. Powder of flaked graphite after a flaking treatment may also be used. Expanded graphite is a product obtained by intercalating, between layers of scale-like graphite, a material that generates a gas when heated. The expanded graphite powder may be composed of either natural graphite or artificial graphite. Powder of flaked expanded graphite after a flaking treatment may also be used as the expanded graphite powder.

The particle diameter of the graphite powder or the expanded graphite powder is preferably relatively large to such an extent that the powder can be treated with a wet jet mill. If the particle diameter of the raw material powder is small, the length (area) in the surface direction of multilayer graphene (flake-like carbon material) obtained after the grinding treatment will also become small. In this case, the particles of multilayer graphene may become less likely to contact one another. As a result, the initial conductivity and the conductivity after repeated expansion may decrease. For these reasons, the average particle diameter of the graphite powder or the expanded graphite powder is preferably 45 µm or more. In the specification, a median diameter measured using a laser diffraction/scattering particle size distribution analyzer ("Microtrac MT3000" from MicrotracBEL Corporation) is adopted as the average particle diameter of the graphite powder or the expanded graphite powder. As the sample for measurement of the particle size distribution, a dispersion (refractive index: 1.38) in which the powder to be measured is dispersed in methyl ethyl ketone is used.

The amount of the graphite powder and the expanded graphite powder, of the conductive agent, to be blended is 20 parts by mass or more and 60 parts by mass or less when a total solid content excluding the conductive agent is taken as 100 parts by mass. If the amount of the graphite powder and the expanded graphite powder is less than 20 parts by mass, it will be difficult to produce a conductive film having a gloss level of the surface of 0.4% or more. Moreover, the particles of multilayer graphene will become less likely to contact one another in the conductive film, and conduction paths that can tolerate elongation cannot be formed. Conversely, if the amount of the graphite powder and the expanded graphite powder is over 60 parts by mass, it will be difficult to produce a flexible conductive film.

The liquid composition may contain other conductive agents in addition to the graphite powder and the expanded graphite powder. Suitable examples of other conductive agents include conductive carbon blacks and carbon nanotubes.

The solvent is preferably a solvent that can dissolve the polymer of the elastomer. For example, butyl cellosolve acetate, acetylacetone, or isophorone may be used as the solvent. Moreover, the boiling point of the solvent may be adjusted in accordance with the coating method to be used in the subsequent curing step.

The liquid composition may contain additives such as a crosslinking agent, a crosslinking accelerator, a crosslinking aid, a dispersant, a plasticizer, a processing aid, an antioxidant, a softener, a colorant, a defoaming agent, a leveling agent, and a viscosity modifier. The crosslinking agent, crosslinking accelerator, crosslinking aid, and the like that contribute to the crosslinking reaction may be selected as appropriate, in accordance with the type of the elastomer. The plasticizer and the dispersant are as described above in connection with the conductive film of the present invention. When a plasticizer is blended into the conductive film of the present invention, the amount of the plasticizer may be 5 parts by mass or more and 35 parts by mass or less when a total solid content excluding the conductive agent is taken as 100 parts by mass. When a dispersant is blended into the conductive film of the present invention, the amount of the dispersant may be 5 parts by mass or more and 40 parts by mass or less when a total solid content excluding the conductive agent is taken as 100 parts by mass.

[Grinding Treatment Step]

This step is the step of subjecting the liquid composition prepared in the preceding step to a grinding treatment using a wet jet mill.

In a wet jet mill, the liquid composition is pressurized with a high pressure pump and fed into a nozzle from which the liquid composition is discharged at high speed. Then, the graphite powder and the like in the liquid composition are subjected to the grinding treatment by a high-speed shear force generated during the passage of the liquid composition through the nozzle, cavitation, and an impact force due to collisions of the liquid composition with the wall or collisions between the particles of the liquid composition. Such a wet jet mill applies a shear force to the graphite powder and the expanded graphite powder, allowing exfoliation to readily proceed. In this manner, multilayer graphene (flake-like carbon material) on the order of nanometers can be readily obtained. The conditions of the wet jet mill, such as the treatment pressure, the type and the diameter of the nozzle, and the number of times of the treatment, may be adjusted as appropriate to obtain a desired flake-like carbon material. From the viewpoint of allowing flaking to proceed, a nozzle configured to readily cause collisions of the liquid composition with the wall or collisions between the particles of the liquid composition, such as an impingement (cross)-type nozzle, may be selected as the type of the nozzle. The grinding treatment is preferably repeated twice or more. That is, the liquid composition is preferably discharged twice or more from the nozzle of the wet jet mill.

[Curing Step]

This step is the step of applying the liquid composition after the grinding treatment to a base material, and curing the coating film to obtain a conductive film in which a gloss level of a surface of the conductive film measured at an incidence angle of 20° is more than 0.4% and less than 10%.

The coating method for the liquid composition is not particularly limited. Examples of the coating method include printing methods such as ink-jet printing, flexographic printing, gravure printing, screen printing, pad printing, metal mask printing, and lithography, as well as a dipping method, a spray method, a bar coating method, and a dispenser method. A sheet having elasticity or flexural properties is preferred as the base material. Examples of such sheets include elastomer sheets formed of crosslinked rubbers, such as acrylic rubber, EPDM, nitrile rubber, hydrogenated nitrile rubber, urethane rubber, butyl rubber, silicone rubber, chloroprene rubber, and ethylene-vinyl acetate copolymer, or thermoplastic elastomers, such as urethane-, ester-, amide-, and acrylic-based thermoplastic elastomers, and resin sheets formed of polyimide, polyethylene, PET, and polyethylene naphthalate (PEN). When the conductive film of the present invention is formed on the surface of an expandable and contractible base material, the conductive film can more effectively exhibit the effect of having high flexibility, and being less likely to increase the electrical resistance during expansion. The curing temperature for the coating film may be determined as appropriate, in consideration of the type of the solvent used, the crosslinking temperature of the elastomer, and the like. The thickness of the conductive film may be determined as appropriate, in accordance with the use. For example, when the conductive film of the present invention is used as electrodes and electric wires for a transducer, the thickness of the conductive film may be 1 µm or more and 500 µm or less.

(2) Second Method for Producing Conductive Film

A second method for producing a conductive film of the present invention includes a grinding treatment step, a liquid composition preparation step, and a curing step. Each of these steps will be described in the mentioned order, hereinafter.

[Grinding Treatment Step]

This step is the step of subjecting a conductive agent dispersion including a solvent and a conductive agent including at least one of graphite powder and expanded graphite powder to a grinding treatment using a wet jet mill. This step is identical to the liquid composition preparation step of the above-described first method for producing a conductive film of the present invention, except that the conductive agent dispersion, instead of the liquid composition, is subjected to the grinding treatment. That is, the conductive agent dispersion, instead of the liquid composition, may be discharged from the nozzle of the wet jet mill. The conductive agent and the solvent contained in the conductive agent dispersion are as described above in connection with the first method. The solvent is preferably the same as that used for preparing an elastomer solution in the subsequent step. When a dispersant is used, the dispersant is preferably blended into the conductive agent dispersion in this step.

[Liquid Composition Preparation Step]

This step is the step of adding an elastomer solution including an elastomer and a solvent to the conductive agent dispersion after the grinding treatment to prepare a liquid composition. The elastomer and the solvent are as described above in connection with the first method. As in the first method, the liquid composition may contain additives such as a crosslinking agent, a crosslinking accelerator, a crosslinking aid, a plasticizer, a processing aid, an antioxidant, a softener, a colorant, a defoaming agent, a leveling agent, and a viscosity modifier.

[Curing Step]

This step is the step of applying the liquid composition prepared in the preceding step to a base material, and curing the coating film to obtain a conductive film in which a gloss level of a surface of the conductive film measured at an incidence angle of 20° is more than 0.4% and less than 10%. This step is identical to the curing step of the above-described first method for producing a conductive film of the present invention.

EXAMPLES

The present invention will be described in more detail with reference to examples.

<Production of Conductive Films>

(1) Conductive films were produced using the raw materials shown in Table 1 in the blending proportions shown in Tables 2 to 4. In Table 1, glycidyl ether group-modified acrylic rubber polymer-1 was produced by suspension polymerization of three monomers. Ethyl acrylate (EA), acrylonitrile (AN), and allyl glycidyl ether (AGE) were used as the monomers. The proportions of the monomers to be blended were as follows: 96% by mass of EA, 2% by mass of AN, and 2% by mass of AGE. The resulting acrylic rubber polymer had a Tg of −10° C.

The conductive agent (F) was produced by subjecting multi-walled carbon nanotubes ("VGCF (registered trademark)" from Showa Denko K.K, fiber diameter: 150 nm, length: 10 μm) to wet grinding. The multi-walled carbon nanotubes, together with methyl ethyl ketone, were placed in a bead mill, and subjected to wet grinding at a peripheral speed of 10 m/s for a residence time of 15 minutes. Zirconia beads with a diameter of 0.5 mm were used as the media of the bead mill (the same applies below).

The dispersant (b) is naphthalene-1,4,5,8-tetracarboxylic dianhydride (NTCDA)-polyetherimide. The reaction process is shown by the following formulas (b).

Reaction process (b)

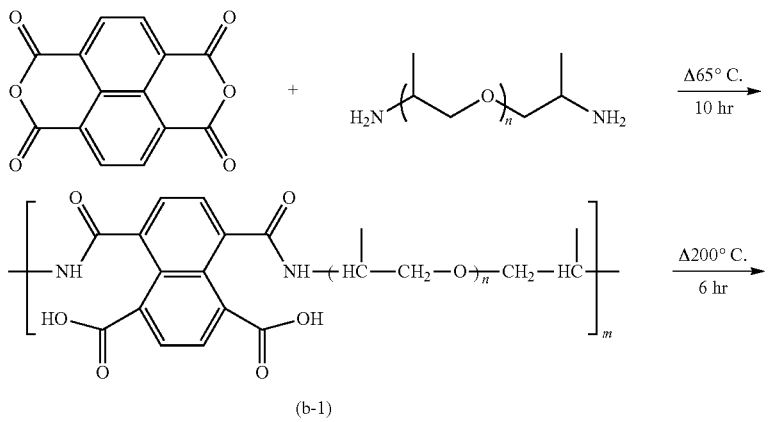

(b-1)

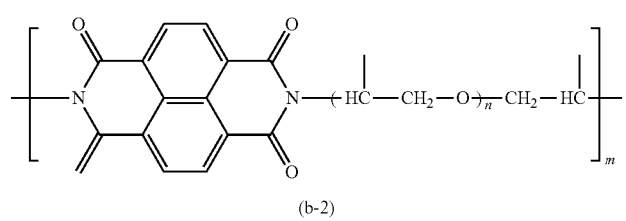

(b-2)

Initially, 4.02 g (15.00 mmol) of NTCDA (molecular weight: 268.18) was weighed out and placed in a three-necked flask, together with 200 ml of tetrahydrofuran (THF) as a solvent, and then nitrogen was bubbled into the mixture for 30 minutes. Then, 30.00 g (15.00 mmol) of poly(propylene glycol) bis(2-aminopropyl ether) ("JEFFAMINE (registered trademark) D2000" from Huntsman Corporation, molecular weight: 2000), which is a polyether modified with amino groups at both ends, was weighed out and poured into the three-necked flask with stirring, and then the polymerization reaction was performed by heating to reflux in a nitrogen atmosphere at 65° C. for 10 hours. After the completion of the reaction, the reaction mixture was dried under reduced pressure to remove THF to obtain NTCDA-polyetheramide of the structure represented by formula (b-1). Subsequently, NTCDA-polyetheramide was placed in a recovery flask and heated to reflux at 200° C. for 6 hours, and then dried under reduced pressure to obtain NTCDA-polyetherimide of the structure represented by formula (b-2).

The dispersant (e) is a polymer represented by structural formula (e) shown below. The polymer of structural formula (e) has a mass average molecular weight of about 1500.

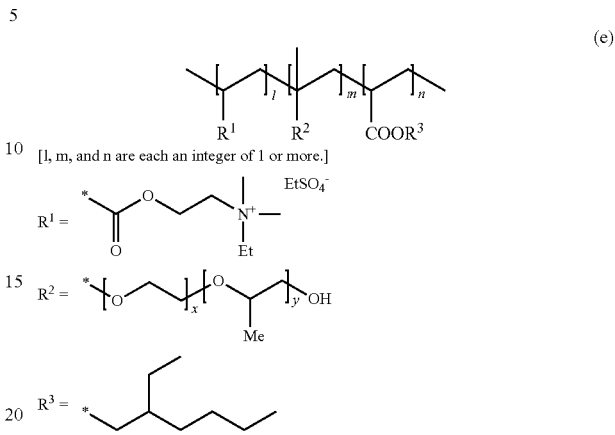

[l, m, and n are each an integer of 1 or more.]

TABLE 1

| Raw Materials | Components | Trade Names (*1 denotes a trademark) |
| --- | --- | --- |
| Polymer | Glycidyl Ether Group-Modified Acrylic Rubber-1 (Tg: −10° C.) | — |
| | Epoxy Group-Modified Acrylic Rubber-1 (Tg: −14° C.) | "Nipol*1 AR51" from Zeon Corporation |
| | Carboxyl Group-Modified Hydrogenated Nitrite Rubber (Tg: −10° C.) | "Therban*1 XT8889" from LANXESS Corporation |
| | Amorphous Polyester Elastomer (Tg: −18° C.) | "VYLON*1 BX1001" from Toyobo, Co., Ltd. |
| Conductive Agent | (A) Flaked Graphite Powder (Average Particle Diameter: 87.2 μm) | "iGurafen-α" from ITEC Corporation |
| | (B) Expanded Graphite Powder (Average Particle Diameter: 211.7 μm) | "EC10" from Ito Graphite Co., Ltd. |
| | (C) Conductive Carbon Black (Average Particle Diameter of Primary Particles: 34 nm) | "ECP-600JD" from Lion Corporation |
| | (D) Expanded Graphite Powder (Average Particle Diameter: 38.4 μm) | "CMX-20" from Nippon Graphite Industries, Co., Ltd. |
| | (E) Multi-Walled Carbon Nanotubes (Diameter: 15 nm, Length: 3 μm) | "VGCF*1-X" from Showa Denko K.K. |
| | (F) Ground Product of Multi-Walled Carbon Nanotubes (Diameter: 150 nm, Length: 10 μm) | — |
| | (G) Expanded Graphite Powder (Average Particle Diameter: 7.9 μm) | "EC1500" from Ito Graphite Co., Ltd. |
| | (H) Multi-Walled Carbon Nanotubes (Diameter: 150 nm, Length: 10 μm) | "VGCF*1" from Showa Denko K.K. |
| Dispersant | (a) High-Molecular-Weight Polyester Acid Amidoamine Salt | "DISPARLON*1 DA7301" from Kusumoto Chemicals, Ltd. |
| | (b) Polymer in Which Naphthalene Component and Polyether Component Form Imide Bond | — |
| | (c) Phosphate Salt of High-Molecular-Weight Copolymer | "DISPER BYK145" from BYK Japan KK |
| | (d) Alkyl Ammonium Salt of High-Molecular-Weight Copolymer | "BYK9076" from BYK Japan KK |
| | (e) Polymer of Structural Formula (e) | — |
| Crosslinking Agent | Amino Group-Terminated Butadiene-Acrylonitrile Copolymer | "ATBN1300x16" from CVC Thermoset Specialties Ltd. |
| Crosslinking Accelerator | Zinc Complex | "XK-614" from KING INDUSTRIES, INC |

TABLE 2

| Raw Materials | Components | Example 1 | Example 2 | Example 3 | Example 4 | Example 5 | Example 6 | Example 7 | Example 8 |
| --- | --- | --- | --- | --- | --- | --- | --- | --- | --- |
| Polymer | Glycidyl Ether Group-Modified Acrylic Rubber-1 | 68 | 68 | 68 | 75 | 84 | 68 | 68 | 68 |
| | Epoxy Group-Modified Acrylic Rubber-1 | — | — | — | — | — | — | — | — |
| | Carboxyl Group-Modified Hydrogenated Nitrile Rubber | — | — | — | — | — | — | — | — |
| | Amorphous Polyester Elastomer | — | — | — | — | — | — | — | — |
| Conductive Agent | (A) Flaked Graphite Powder (Average Particle Diameter: 87.2 μm) | 25 | 35 | 50 | 35 | 35 | 35 | 35 | 35 |
| | (B) Expanded Graphite Powder (Average Particle Diameter: 211.7 μm) | — | — | — | — | — | — | — | — |
| | (C) Conductive Carbon Black (Average Particle Diameter of Primary Particles: 34 nm) | — | — | — | — | — | — | — | — |

TABLE 2-continued

| Raw Materials | Components | Example 1 | Example 2 | Example 3 | Example 4 | Example 5 | Example 6 | Example 7 | Example 8 |
|---|---|---|---|---|---|---|---|---|---|
| | (D) Expanded Graphite Powder (Average Particle Diameter: 38.4 µm) | — | — | — | — | — | — | — | — |
| | (E) Multi-Walled Carbon Nanotubes (Diameter: 15 nm, Length: 3 µm) | — | — | — | — | — | — | — | — |
| | (F) Ground Product of Multi-Walled Carbon Nanotubes (Diameter: 150 nm, Length: 10 µm) | — | — | — | — | — | — | — | — |
| | (G) Expanded Graphite Powder (Average Particle Diameter: 7.9 µm) | — | — | — | — | — | — | — | — |
| | (H) Multi-Walled Carbon Nanotubes (Diameter: 150 nm, Length: 10 µm) | — | — | — | — | — | — | — | — |
| Dispersant | (a) High-Molecular-Weight Polyester Acid Amidoamine Salt | 25 | 25 | 25 | 25 | 9 | — | — | — |
| | (b) Polymer in Which Naphthalene Component and Polyether Component Form Imide Bond | — | — | — | — | — | 25 | — | — |
| | (c) Phosphate Salt of High-Molecular-Weight Copolymer | — | — | — | — | — | — | 25 | — |
| | (d) Alkyl Ammonium Salt of High-Molecular-Weight Copolymer | — | — | — | — | — | — | — | 25 |
| | (e) Polymer of Structural Formula (e) | — | — | — | — | — | — | — | — |
| Crosslinking Agent | Amino Group-Terminated Butadiene-Acrylonitrile Copolymer | 6 | 6 | 6 | — | 6 | — | — | — |
| Crosslinking Accelerator | Zinc Complex | 1 | 1 | — | — | 1 | — | — | — |
| | Solvent | Butyl Cellosolve Acetate | | | | | | | |
| | Dispersion/Grinding Treatment Method | Wet Jet Mill | | | | | | | |
| | Solids Content [%] | 17.6 | 24.0 | 20.0 | 19.5 | 20.0 | 20.3 | 19.6 | 19.8 |
| Evaluation | Gloss Level [%]: Incident Angle 20° | 0.5 | 0.7 | 0.6 | 0.6 | 0.5 | 0.6 | 0.7 | 0.6 |
| | Initial Electrical Resistivity [Ω · cm] | 0.040 | 0.024 | 0.020 | 0.025 | 0.041 | 0.011 | 0.028 | 0.030 |
| | Maximum Electrical Resistivity in Elongation Durability Test [Ω · cm] | 0.66 | 0.54 | 0.62 | 0.61 | 0.88 | 0.48 | 0.64 | 0.78 |

TABLE 3

| Raw Materials | Components | Example 9 | Example 10 | Example 11 | Example 12 | Example 13 | Example 14 |
|---|---|---|---|---|---|---|---|
| Polymer | Glycidyl Ether Group-Modified Acrylic Rubber-1 | 68 | 68 | 68 | — | — | — |
| | Epoxy Group-Modified Acrylic Rubber-1 | — | — | — | — | — | 68 |
| | Carboxyl Group-Modified Hydrogenated Nitrile Rubber | — | — | — | 82 | — | — |
| | Amorphous Polyester Elastomer | — | — | — | — | 82 | — |
| Conductive Agent | (A) Flaked Graphite Powder (Average Particle Diameter: 87.2 µm) | — | 25 | 30 | 50 | 50 | 35 |
| | (B) Expanded Graphite Powder (Average Particle Diameter: 211.7 µm) | 35 | — | — | — | — | — |
| | (C) Conductive Carbon Black (Average Particle Diameter of Primary Particles: 34 nm) | — | 10 | 5 | — | — | — |
| | (D) Expanded Graphite Powder (Average Particle Diameter: 38.4 µm) | — | — | — | — | — | — |
| | (E) Multi-Walled Carbon Nanotubes (Diameter: 15 nm, Length: 3 µm) | — | — | — | — | — | — |
| | (F) Ground Product of Multi-Walled Carbon Nanotubes (Diameter: 150 nm, Length: 10 µm) | — | — | — | — | — | — |
| | (G) Expanded Graphite Powder (Average Particle Diameter: 7.9 µm) | — | — | — | — | — | — |
| | (H) Multi-Walled Carbon Nanotubes (Diameter: 150 nm, Length: 10 µm) | — | — | — | — | — | — |
| Dispersant | (a) High-Molecular-Weight Polyester Acid Amidoamine Salt | 25 | 25 | 25 | 18 | 18 | 25 |
| | (b) Polymer in Which Naphthalene Component and Polyether Component Form Imide Bond | — | — | — | — | — | — |

TABLE 3-continued

| Raw Materials | Components | Example 9 | Example 10 | Example 11 | Example 12 | Example 13 | Example 14 |
|---|---|---|---|---|---|---|---|
| | (c) Phosphate Salt of High-Molecular-Weight Copolymer | — | — | — | — | — | — |
| | (d) Alkyl Ammonium Salt of High-Molecular-Weight Copolymer | — | — | — | — | — | — |
| | (e) Polymer of Structural Formula (e) | — | — | — | — | — | — |
| Crosslinking Agent | Amino Group-Terminated Butadiene-Acrylonitrile Copolymer | 6 | 6 | 6 | — | — | 6 |
| Crosslinking Accelerator | Zinc Complex | 1 | — | — | — | — | 1 |
| | Solvent | Butyl Cellosolve Acetate | | | Acetylacetone | Isophorone | Butyl Cellosolve Acetate |
| | Dispersion/Grinding Treatment Method | Wet Jet Mill | | | | | |
| | Solids Content [%] | 20.0 | 20.3 | 20.1 | 16.0 | 16.0 | 22.0 |
| Evaluation | Gloss Level [%]: Incident Angle 20° | 0.5 | 0.5 | 0.5 | 0.5 | 0.5 | 0.7 |
| | Initial Electrical Resistivity [Ω · cm] | 0.024 | 0.038 | 0.030 | 0.021 | 0,050 | 0.022 |
| | Maximum Electrical Resistivity in Elongation Durability Test [Ω · cm] | 0.66 | 0.68 | 0.70 | 0.53 | 0.95 | 0.60 |

TABLE 4

| Raw Materials | Components | Comparative Example 1 | Comparative Example 2 | Comparative Example 3 | Comparative Example 4 | Comparative Example 5 |
|---|---|---|---|---|---|---|
| Polymer | Glycidyl Ether Group-Modified Acrylic Rubber-1 | 68 | 68 | 68 | 68 | 80 |
| | Epoxy Group-Modified Acrylic Rubber-1 | — | — | — | — | — |
| | Carboxyl Group-Modified Hydrogenated Nitrile Rubber | — | — | — | — | — |
| | Amorphous Polyester Elastomer | — | — | — | — | — |
| Conductive Agent | (A) Flaked Graphite Powder (Average Particle Diameter: 87.2 μm) | — | — | — | — | — |
| | (B) Expanded Graphite Powder (Average Particle Diameter: 211.7 μm) | — | — | 35 | — | — |
| | (C) Conductive Carbon Black (Average Particle Diameter of Primary Particles: 34 nm) | — | 15 | — | — | — |
| | (D) Expanded Graphite Powder (Average Particle Diameter: 38.4 μm) | 35 | — | — | — | — |
| | (E) Multi-Walled Carbon Nanotubes (Diameter: 15 nm, Length: 3 μm) | — | — | — | — | 25 |
| | (F) Ground Product of Multi-Walled Carbon Nanotubes (Diameter: 150 nm, Length: 10 μm) | — | — | — | — | 20 |
| | (G) Expanded Graphite Powder (Average Particle Diameter: 7.9 μm) | — | — | — | 35 | — |
| | (H) Multi-Walled Carbon Nanotubes (Diameter: 150 nm, Length: 10 μm) | — | 25 | — | — | — |
| Dispersant | (a) High-Molecular-Weight Polyester Acid Amidoamine Salt | 25 | 25 | 25 | 25 | — |
| | (b) Polymer in Which Naphthalene Component and Polyether Component Form Imide Bond | — | — | — | — | — |
| | (c) Phosphate Salt of High-Molecular-Weight Copolymer | — | — | — | — | — |
| | (d) Alkyl Ammonium Salt of High-Molecular-Weight Copolymer | — | — | — | — | — |
| | (e) Polymer of Structural Formula (e) | — | — | — | — | 20 |
| Crosslinking Agent | Amino Group-Terminated Butadiene-Acrylonitrile Copolymer | 6 | 6 | 6 | 6 | — |
| Crosslinking Accelerator | Zinc Complex | 1 | 1 | 1 | 1 | — |
| | Solvent | Butyl Cellosolve Acetate | | | | |
| | Dispersion/Grinding Treatment Method | Wet Jet Mill | Three Roll Mill | Bead Mill | Wet Jet Mill | Bead Mill |
| | Solids Content [%] | 25.0 | 21.0 | 20.0 | 28.0 | 5.0 |
| Evaluation | Gloss Level [%]: Incident Angle 20° | 0.4 | 0.1 | 0.4 | 0.2 | 0.3 |
| | Initial Electrical Resistivity [Ω · cm] | 1.500 | 0.210 | 0.141 | 7.982 | 0.070 |
| | Maximum Electrical Resistivity in Elongation Durability Test [Ω · cm] | >150 | 4.60 | >14.1 | >798 | 1.50 |

[Method for Producing Conductive Films of Examples 1 to 11 and 14, and Comparative Examples 1 and 4]

Conductive films of Examples 1 to 11 and 14, and Comparative Examples 1 and 4 were produced using the first method for producing a conductive film of the present invention. Initially, a liquid composition was prepared by adding a conductive agent, a dispersant, a crosslinking agent, and a crosslinking accelerator to a polymer solution obtained by dissolving a polymer in butyl cellosolve acetate. Then, the liquid composition was subjected to a grinding treatment using a wet jet mill ("NanoVater (registered trademark)" from Yoshida Kikai Co., Ltd.). Using pass operation, the grinding treatment was performed a total of six times (six-pass treatment). The first pass was performed with a straight nozzle (nozzle diameter: 170 μm) at a treatment pressure of 90 MPa, and the second and subsequent passes were performed with a cross nozzle (nozzle diameter: 170 μm) at a treatment pressure of 130 MPa. The liquid composition after the grinding treatment was applied onto a base material to a target thickness of 20 μm, using a bar coating method, and heated at 150° C. for 2 hours to cure the coating film. As the base material, two types of sheets, i.e., a PET sheet and a thermoplastic elastomer sheet ("ESMER (registered trademark) URS" from Nihon Matai Co., Ltd., thickness: 0.2 mm), were used.

[Method for Producing Conductive Films of Examples 12 and 13]

Conductive films of Examples 12 and 13 were produced using the second method for producing a conductive film of the present invention. Initially, a conductive agent dispersion was prepared by adding a dispersant and a solvent to a conductive agent. Then, the prepared conductive agent dispersion was subjected to a grinding treatment using a wet jet mill (the same as described above). Using pass operation, the grinding treatment was performed a total of three times (three-pass treatment). The first pass was performed with a straight nozzle (nozzle diameter: 170 μm) at a treatment pressure of 90 MPa, and the second and subsequent passes were performed with a cross nozzle (nozzle diameter: 170 μm) at a treatment pressure of 130 MPa. Then, a polymer solution obtained by dissolving a polymer in a solvent, a crosslinking agent, and a crosslinking accelerator were added to the conductive agent dispersion after the grinding treatment and mixed to prepare a liquid composition. The resulting liquid composition was applied onto a base material to a target thickness of 20 μm, using a bar coating method, and heated at 150° C. for 2 hours to cure the coating film. As the base material, two types of sheets, i.e., a PET sheet and a thermoplastic elastomer sheet (the same as described above), were used. The polymer solution in these examples is included in the concept of the elastomer solution of the present invention.

[Method for Producing Conductive Film of Comparative Example 2]

A conductive agent, a dispersant, a crosslinking agent, a crosslinking accelerator, and butyl cellosolve acetate were added to a polymer, and the mixture was kneaded with a three roll mill to prepare a liquid composition. The resulting liquid composition was cured in the same manner as in Example 1.

[Method for Producing Conductive Film of Comparative Example 3]

A liquid composition was prepared by adding a conductive agent, a dispersant, a crosslinking agent, and a crosslinking accelerator to a polymer solution obtained by dissolving a polymer in butyl cellosolve acetate. The prepared liquid composition was placed in a bead mill and treated at a peripheral speed of 10 m/s for a residence time of 15 minutes. The liquid composition after the treatment was cured in the same manner as in Example 1.

[Method for Producing Conductive Film of Comparative Example 5]

A liquid composition was prepared by adding a dispersant, and then a conductive agent, to a polymer solution obtained by dissolving a polymer in butyl cellosolve acetate. The prepared liquid composition was placed in a bead mill and treated at a peripheral speed of 10 m/s for a residence time of 15 minutes. The liquid composition after the treatment was cured in the same manner as in Example 1.

(2) Conductive films were produced using the raw materials shown in Table 5 in the blending proportions shown in Tables 6 and 7. In Table 5, glycidyl ether group-modified acrylic rubber polymer-2 was produced by suspension polymerization of three monomers. Butyl acrylate (BA), acrylonitrile (AN), and allyl glycidyl ether (AGE) were used as the monomers. The proportions of the monomers to be blended were as follows: 96% by mass of BA, 2% by mass of AN, and 2% by mass of AGE. The resulting acrylic rubber polymer had a Tg of −45° C. The ternary fluororubber polymer is a vinylidene fluoride-tetrafluoroethylene-hexafluoropropylene copolymer.

TABLE 5

| Raw Materials | Components | Trade Names (*1 denotes a trademark) |
|---|---|---|
| Polymer | Glycidyl Ether Group-Modified Acrylic Rubber-1 (Tg: −10° C.) | — |
| | Glycidyl Ether Group-Modified Acrylic Rubber-2 (Tg: −45° C.) | — |
| | Epoxy Group-Modified Acrylic Rubber-2 (Tg: −37° C.) | "Nipol*1 AR54" from Zeon Corporation |
| | Ternary Fluororubber (Tg: −15° C.) | "DAI-EL*1 G555" from Daikin Industries, Ltd. |
| Conductive Agent | (A) Flaked Graphite Powder (Average Particle Diameter: 87.2 μm) | "iGurafen-α" from ITEC Corporation |
| Dispersant | (a) High-Molecular-Weight Polyester Acid Amidoamine Salt | "DISPARLON*1 DA7301" from Kusumoto Chemicals, Ltd. |
| Crosslinking Agent | Amino Group-Terminated Butadiene-Acrylonitrile Copolymer | "ATBN1300x16" from CVC Thermoset Specialties Ltd. |
| | Polyisocyanate | — |
| Crosslinking Accelerator | Zinc Complex | "XK-614" from KING INDUSTRIES, INC |

TABLE 6

| Raw Materials | Components | Example 15 | Example 16 | Example 17 | Example 18 | Example 19 | Example 20 | Example 21 |
|---|---|---|---|---|---|---|---|---|
| Polymer | Glycidyl Ether Group-Modified Acrylic Rubber-1 | 47.6 | 34 | 20.4 | 47.6 | 34 | 20.4 | — |
| | Glycidyl Ether Group-Modified Acrylic Rubber-2 | 20.4 | 34 | 47.6 | — | — | — | — |
| | Epoxy Group-Modified Acrylic Rubber-2 | — | — | — | 20.4 | 34 | 47.6 | 68 |
| | Ternary Fluororubber | — | — | — | — | — | — | — |
| Conductive Agent | (A) Flaked Graphite Powder (Average Particle Diameter: 87.2 μm) | 35 | 35 | 35 | 35 | 35 | 35 | 35 |
| Dispersant | (a) High-Molecular-Weight Polyester Acid Amidoamine Salt | 25 | 25 | 25 | 25 | 25 | 25 | 25 |
| Crosslinking Agent | Amino Group-Terminated Butadiene-Acrylonitrile Copolymer | 6 | 6 | 6 | 6 | 6 | 6 | 6 |
| | Polyisocyanate | — | — | — | — | — | — | — |
| Crosslinking Accelerator | Zinc Complex | 1 | 1 | 1 | 1 | 1 | 1 | 1 |

TABLE 6-continued

| Raw Materials | Components | Example 15 | Example 16 | Example 17 | Example 18 | Example 19 | Example 20 | Example 21 |
|---|---|---|---|---|---|---|---|---|
| Plasticizer | Adipic Acid Diester | — | — | — | — | — | — | — |
| Processing Aid | Magnesium Oxide | — | — | — | — | — | — | — |
| | Unbaked Eggshell Calcium | — | — | — | — | — | — | — |
| | Solvent | Butyl Cellosolve Acetate | | | | | | |
| | Dispersion/Grinding Treatment Method | Wet Jet Mill | | | | | | |
| | Solids Content [%] | 22.0 | 22.0 | 22.0 | 22.0 | 22.0 | 22.0 | 22.0 |
| Evaluation | Gloss Level [%]: Incident Angle 20° | 0.7 | 0.6 | 0.6 | 0.5 | 0.7 | 0.6 | 0.7 |
| | Initial Electrical Resistivity [Ω · cm] | 0.027 | 0.023 | 0.025 | 0.026 | 0.018 | 0.020 | 0.020 |
| | Maximum Electrical Resistivity in Elongation Durability Test [Ω · m] | 1.46 | 1.31 | 1.35 | 0.91 | 0.72 | 1.14 | 1.40 |

TABLE 7

| Raw Materials | Components | Example 22 | Example 23 | Example 24 | Example 25 |
|---|---|---|---|---|---|
| Polymer | Glycidyl Ether Group-Modified Acrylic Rubber-1 | 68 | 68 | 68 | — |
| | Glycidyl Ether Group-Modified Acrylic Rubber-2 | — | — | — | — |
| | Epoxy Group-Modified Acrylic Rubber-2 | — | — | — | — |
| | Ternary Fluororubber | — | — | — | 54 |
| Conductive Agent | (A) Flaked Graphite Powder (Average Particle Diameter: 87.2 μm) | 35 | 35 | 35 | 35 |
| Dispersant | (a) High-Molecular-Weight Polyester Acid Amidoamine Salt | 25 | 25 | 25 | 25 |
| Crosslinking Agent | Amino Group-Terminated Butadiene-Acrylonitrile Copolymer | 6 | 6 | 6 | — |
| | Polyisocyanate | — | — | — | 15 |
| Crosslinking Accelerator | Zinc Complex | 1 | 1 | 1 | — |
| Plasticizer | Adipic Acid Diester | 5 | 15 | 25 | — |
| Processing Aid | Magnesium Oxide | — | — | — | 3 |
| | Unbaked Eggshell Calcium | — | — | — | 3 |
| Solvent | | Butyl Cellosolve Acetate | | | Isophorone + Acetic Acid |
| Dispersion/Grinding Treatment Method | | Wet Jet Mill | | | |
| Solids Content [%] | | 25.0 | 26.0 | 27.0 | 17.5 |
| Evaluation | Gloss Level [%]: Incident Angle 20° | 0.5 | 0.6 | 0.6 | 0.5 |
| | Initial Electrical Resistivity [Ω · cm] | 0.022 | 0.024 | 0.027 | 0.031 |
| | Maximum Electrical Resistivity in Elongation Durability Test [Ω · m] | 0.73 | 0.89 | 0.95 | 0.80 |

[Method for Producing Conductive Films of Examples 15 to 25]

Conductive films of Examples 15 to 25 were produced using the first method for producing a conductive film of the present invention. In Examples 15 to 24, initially, a liquid composition was prepared by adding a conductive agent, a dispersant, a crosslinking agent, and a crosslinking accelerator to a polymer solution obtained by dissolving a polymer in butyl cellosolve acetate. In Examples 22 to 24, a plasticizer was also added. In Example 25, initially, a polymer solution was prepared by dissolving a mixture obtained by kneading a processing aid into a polymer, in isophorone mixed with 1.6% by mass of acetic acid. Then, a conductive agent, a dispersant, and a crosslinking agent were added to the prepared polymer solution to prepare a liquid composition. Then, the liquid composition was subjected to a grinding treatment using a wet jet mill (the same as described above). Using pass operation, the grinding treatment was performed a total of six times (six-pass treatment). The first pass was performed with a straight nozzle (nozzle diameter: 170 μm) at a treatment pressure of 90 MPa, and the second and subsequent passes were performed with a cross nozzle (nozzle diameter: 170 μm) at a treatment pressure of 130 MPa. The liquid composition after the grinding treatment was applied onto a base material to a target thickness of 20 μm, using a bar coating method, and heated at 150° C. for 2 hours to cure the coating film. As the base material, two types of sheets, i.e., a PET sheet and a thermoplastic elastomer sheet (the same as described above), were used.

<Method for Evaluating Conductive Films>

[Gloss Level]

The gloss level of the surface of each conductive film with a thickness of 20 μm formed on the PET sheet was measured at an incident angle of 20°, using a gloss meter "PG-1M" from Nippon Denshoku Industries Co., Ltd.

[Initial Electrical Resistivity]

The volume resistivity of each of the conductive films with a thickness of 20 μm formed on the PET sheet was measured using a low resistivity meter "Loresta (registered trademark) GP" from Mitsubishi Chemical Analytech Co., Ltd. (voltage: 5 V, in accordance with JIS K7194: 1994). The measured volume resistivity was determined as the initial (before expansion) electrical resistivity.

[Maximum Electrical Resistivity in Elongation Durability Test]

The sample in which each of the conductive films with a thickness of 20 μm was formed on the thermoplastic elastomer sheet was cut into the dumbbell shape No. 2 specified in JIS K6251: 2010 to prepare a specimen. Sheets of copper foil were attached to positions 10 mm from both ends of the specimen. A pair of bench marks were drawn at positions 10 mm on both sides from the longitudinal center of the specimen to set the test length to 20 mm on the specimen.

Initially, the electrical resistivity value R1 between the sheets of copper foil upon application of a voltage of 1 V was measured. Then, the specimen was expanded by pulling one end thereof until the test length became 30 mm (expansion ratio: 50%), and then returned to the original state. The expansion and contraction were repeated 25000 times at a frequency of 3.4 Hz while applying a voltage of 1 V, and electrical resistivity values between the sheets of copper foil were measured. The maximum electrical resistivity value R2 thus measured was divided by the electrical resistivity value R1 to calculate the change factor (R2/R1). Then, the above-described initial electrical resistivity was multiplied by the change factor thus calculated, and the resulting value was determined as the maximum electrical resistivity in the elongation durability test.

<Results of Evaluation of Conductive Films>

Tables 2 to 4 above show a summary of the results of evaluation of the conductive films of Examples 1 to 14 and Comparative Examples 1 to 5. Tables 6 and 7 above show a summary of the results of evaluation of the conductive films of Examples 15 to 25. FIG. 1 shows a graph of the relationship between the gloss level and the initial electrical resistivity of the conductive films. FIG. 2 shows a graph of the relationship between the gloss level and the maximum electrical resistivity in the elongation durability test of the conductive films.

As shown in Tables 2 to 4, the conductive films of Examples 1 to 14 had gloss levels of 0.5% or more, i.e., more than 0.4%. Moreover, the conductive films of Examples 1 to 14 had low initial electrical resistivities of 0.050 Ω·cm or less, and had low maximum electrical resistivities of 0.95 Ω·cm or less in the elongation durability test. As shown in Tables 6 and 7, the conductive films of Examples 15 to 25 had gloss levels of 0.5% or more, i.e., more than 0.4%. Moreover, the conductive films of Examples 15 to 25 had low initial electrical resistivities of 0.031 Ω·cm or less, and had low maximum electrical resistivities of 1.46 Ω·cm or less in the elongation durability test. In contrast, the conductive films of Comparative Examples 1 to 5 had gloss levels of 0.4% or less. Moreover, the conductive films of Comparative Examples 1 to 5 had initial electrical resistivities higher than those of the conductive films of Examples 1 to 25. Moreover, the conductive films of Comparative Examples 1 to 4 had maximum electrical resistivities in the elongation durability test that were significantly increased compared to those of the conductive films of Examples 1 to 25.

The relationship between the gloss level and the electrical resistivity is clearly seen from FIGS. 1 and 2. As shown in FIG. 1, the group of comparative examples (Comparative Examples 1 to 5) and the group of examples (Examples 1 to 25) can be divided at a gloss level of 0.4% as the borderline, and this relationship is directly in agreement with the magnitude of the initial electrical resistivity. That is, the group of comparative examples had high initial electrical resistivities, and the group of examples had low initial electrical resistivities. Likewise, in FIG. 2 as well, the relationship between the group of comparative examples and the group of examples divided at a gloss level of 0.4% as the borderline is in agreement with the magnitude of the maximum electrical resistivity.

In each of Comparative Examples 1 and 4, the liquid composition containing the conductive agent was subjected to the grinding treatment with the wet jet mill, as in Examples 1 to 11. However, in Comparative Example 1, the expanded graphite powder (D) having a small particle diameter was used as the raw material conductive agent, and in Comparative Example 4, the expanded graphite powder (G) having an even smaller particle diameter was used as the raw material conductive agent. Thus, it is believed that the length in the surface direction of multilayer graphene obtained after the grinding treatment became small, and multilayer graphene was not sufficiently oriented. This can also be confirmed from the fact that the conductive film of Comparative Example 1 had a low gloss level of 0.4%, and the conductive film of Comparative Example 4 had a low gloss level of 0.2%. Moreover, when the length in the surface direction of multilayer graphene is small, the particles of multilayer graphene are less likely to contact one another. It is believed that for these reasons, these conductive films had high initial electrical resistivities and high maximum electrical resistivities in the elongation durability test.

In Comparative Example 3, the conductive agent (B), which is the same as that in Example 9, i.e., expanded graphite powder, was used. However, because the liquid composition was treated with a bead mill in Comparative Example 3, pulverization due to fracture of expanded graphite was more likely to proceed, rather than flaking due to exfoliation. It is believed that for this reason, the particles of the conductive agent became less likely to contact one another, and the conductive film had a high initial electrical resistivity and a high maximum electrical resistivity in the elongation durability test. This can also be confirmed from the fact that the conductive film of Comparative Example 3 had a gloss level of 0.4%.

In Comparative Example 5, the two types of conductive agents (E) and (F) were used. The conductive agent (E) is formed of multi-walled carbon nanotubes, and the conductive agent (F) is a ground product of multi-walled carbon nanotubes. Moreover, the multi-walled carbon nanotubes were ground using a bead mill, and the liquid composition was treated with a bead mill. It is believed that for this reason, flaking due to grinding was less likely to proceed, and a flake-like carbon material was not sufficiently produced. This can also be confirmed from the fact that the conductive film of Comparative Example 5 had a gloss level of 0.3%.

The foregoing confirmed that the conductive films of the present invention have high initial conductivities, and are less likely to increase the electrical resistance even after repeated expansion. The foregoing also confirmed that these conductive films can be readily produced using the methods for producing a conductive film of the present invention.

The conductive film and the methods for producing the conductive film according to the present invention are suitable for electrodes and electric wires to be used in flexible transducers, as well as electromagnetic wave shields, flexible wiring boards, and the like to be used in wearable devices and the like. The use of the conductive film of the present invention as electrodes or electric wires can improve the durability of electronic devices to be mounted in flexible parts, such as movable units of robots, nursing care equipment, and interiors of transportation equipment.

What is claimed is:

1. A method for producing a conductive film comprising:
preparing a liquid composition including an elastomer, a conductive agent including at least one of graphite powder and expanded graphite powder, and a solvent;
subjecting the liquid composition to a grinding treatment using a wet jet mill to cause the graphite component contained in the liquid composition to be exfoliated and flaked by a shear force during passage through a nozzle; and applying the liquid composition after the grinding treatment to a base material to form a coating film, and curing the coating film to obtain a conductive film in which a gloss level of a surface of the conductive film measured at an incidence angle of 20° is 0.5% or more and less than 10%;

wherein an initial electrical resistivity of the conductive film is 0.04ω·cm or less, and the conductive film does not have a fibrous carbon material.

2. The method for producing a conductive film according to claim 1, wherein the liquid composition includes a dispersant.

3. The method for producing a conductive film according to claim 1, wherein the graphite powder and the expanded graphite powder each have an average particle diameter of 45 μm or more.

4. The method for producing a conductive film according to claim 1, wherein the grinding treatment is repeated twice or more.

5. The method for producing a conductive film according to claim 4, wherein the grinding treatment is performed by passing the liquid composition through a straight nozzle and then through a cross nozzle.

6. The method for producing a conductive film according to claim 1, wherein an amount of the at least one of graphite powder and expanded graphite powder of the conductive agent to be blended is 20 parts by mass or more and 60 parts by mass or less when a total solid content excluding the conductive agent is taken as 100 parts by mass.

7. The method for producing a conductive film according to claim 1, wherein the grinding treatment using a wet jet mill is performed through a cross nozzle.

8. A method for producing a conductive film comprising:
subjecting a conductive agent dispersion including a solvent and a conductive agent including at least one of graphite powder and expanded graphite powder to a grinding treatment using a wet jet mill to cause the graphite component contained in the conductive agent dispersion to be exfoliated and flaked by a shear force during passage through a nozzle;

adding an elastomer solution including an elastomer and a solvent to the conductive agent dispersion after the grinding treatment to prepare a liquid composition; and applying the liquid composition to a base material to form a coating film, and curing the coating film to obtain a conductive film in which a gloss level of a surface of the conductive film measured at an incidence angle of 20° is 0.5% or more and less than 10%;

wherein an initial electrical resistivity of the conductive film is 0.04ω·cm or less, and the conductive film does not have a fibrous carbon material.

9. The method for producing a conductive film according to claim 8, wherein the conductive agent dispersion includes a dispersant.

10. The method for producing a conductive film according to claim 8, wherein the graphite powder and the expanded graphite powder each have an average particle diameter of 45 μm or more.

11. The method for producing a conductive film according to claim 8, wherein the grinding treatment is repeated twice or more.

12. The method for producing a conductive film according to claim 11, wherein the grinding treatment is performed by passing the conductive agent dispersion through a straight nozzle and then through a cross nozzle.

13. The method for producing a conductive film according to claim 8, wherein an amount of the at least one of graphite powder and expanded graphite powder of the conductive agent to be blended is 20 parts by mass or more and 60 parts by mass or less when a total solid content excluding the conductive agent is taken as 100 parts by mass.

14. The method for producing a conductive film according to claim 8, wherein the grinding treatment using a wet jet mill is performed through a cross nozzle.

* * * * *